(12) United States Patent
Hsu et al.

(10) Patent No.: US 11,557,533 B2
(45) Date of Patent: Jan. 17, 2023

(54) PACKAGE STRUCTURE AND MANUFACTURING METHOD THEREOF

(71) Applicant: Powertech Technology Inc., Hsinchu County (TW)

(72) Inventors: Hung-Hsin Hsu, Hsinchu County (TW); Nan-Chun Lin, Hsinchu County (TW)

(73) Assignee: Powertech Technology Inc., Hsinchu County (TW)

( * ) Notice: Subject to any disclaimer, the term of this patent is extended or adjusted under 35 U.S.C. 154(b) by 11 days.

(21) Appl. No.: 17/080,853

(22) Filed: Oct. 27, 2020

(65) Prior Publication Data

US 2021/0202390 A1 Jul. 1, 2021

Related U.S. Application Data

(60) Provisional application No. 62/955,456, filed on Dec. 31, 2019.

(51) Int. Cl.
*H01L 21/48* (2006.01)
*H01L 23/498* (2006.01)
(Continued)

(52) U.S. Cl.
CPC ...... *H01L 23/49838* (2013.01); *H01L 21/481* (2013.01); *H01L 21/4853* (2013.01);
(Continued)

(58) Field of Classification Search
CPC ............. H01L 23/49838; H01L 21/481; H01L 21/4853
See application file for complete search history.

(56) References Cited

U.S. PATENT DOCUMENTS 9,935,046 B1 4/2018 Hung
2011/0057327 A1 3/2011 Yoshida et al.
(Continued)

FOREIGN PATENT DOCUMENTS

CN 107785339 3/2018
CN 107845625 3/2018
(Continued)

OTHER PUBLICATIONS

"Office Action of Taiwan Counterpart Application", dated Oct. 21, 2020, p. 1-p. 6.
(Continued)

*Primary Examiner* — Errol V Fernandes
(74) *Attorney, Agent, or Firm* — JCIPRNET

(57) ABSTRACT

A package structure including a redistribution circuit structure, a first chip, a second chip, a first circuit board, a second circuit board, and a plurality of conductive terminals is provided. The redistribution circuit structure has a first connection surface and a second connection surface opposite to the first connection surface. The first chip and the second chip are disposed on the first connection surface and are electrically connected to the redistribution circuit structure. The first circuit board and the second circuit board are disposed on the second connection surface and are electrically connected to the redistribution circuit structure. The conductive terminals are disposed on the first circuit board or the second circuit board. The conductive terminals are electrically connected to the first circuit board or the second circuit board. A manufacturing method of a package structure is also provided.

16 Claims, 16 Drawing Sheets

(51) Int. Cl.
  *H01L 23/00* (2006.01)
  *H01L 25/18* (2006.01)
  *H01L 21/56* (2006.01)
  *H01L 21/683* (2006.01)
  *H01L 25/065* (2006.01)
  *H01L 25/16* (2006.01)
  *H01L 25/00* (2006.01)
  *H01L 23/31* (2006.01)
  *H01L 23/538* (2006.01)
  *H01L 23/24* (2006.01)
  *H01L 21/78* (2006.01)
  *H01L 23/16* (2006.01)
  *H01L 23/367* (2006.01)
  *H01L 23/552* (2006.01)

(52) U.S. Cl.
  CPC .......... *H01L 21/4857* (2013.01); *H01L 21/56* (2013.01); *H01L 21/565* (2013.01); *H01L 21/568* (2013.01); *H01L 21/6835* (2013.01); *H01L 21/78* (2013.01); *H01L 23/16* (2013.01); *H01L 23/24* (2013.01); *H01L 23/31* (2013.01); *H01L 23/3128* (2013.01); *H01L 23/3675* (2013.01); *H01L 23/49811* (2013.01); *H01L 23/49816* (2013.01); *H01L 23/49822* (2013.01); *H01L 23/49833* (2013.01); *H01L 23/5385* (2013.01); *H01L 23/5386* (2013.01); *H01L 23/562* (2013.01); *H01L 24/05* (2013.01); *H01L 24/13* (2013.01); *H01L 24/14* (2013.01); *H01L 24/16* (2013.01); *H01L 24/17* (2013.01); *H01L 25/0652* (2013.01); *H01L 25/0655* (2013.01); *H01L 25/16* (2013.01); *H01L 25/18* (2013.01); *H01L 25/50* (2013.01); *H01L 21/561* (2013.01); *H01L 23/552* (2013.01); *H01L 2221/68359* (2013.01); *H01L 2224/02311* (2013.01); *H01L 2224/02313* (2013.01); *H01L 2224/02379* (2013.01); *H01L 2224/02381* (2013.01); *H01L 2224/13024* (2013.01); *H01L 2224/16145* (2013.01); *H01L 2224/16227* (2013.01); *H01L 2224/1716* (2013.01)

(56) References Cited

U.S. PATENT DOCUMENTS

| | | |
|---|---|---|
| 2016/0056055 A1 | 2/2016 | Ko et al. |
| 2016/0358865 A1 | 12/2016 | Shih et al. |
| 2016/0379915 A1* | 12/2016 | Lee ................... H01L 23/49822 257/737 |
| 2017/0040290 A1 | 2/2017 | Lin et al. |
| 2017/0194310 A1* | 7/2017 | Evans ............... H01L 31/02005 |
| 2017/0263544 A1 | 9/2017 | Hiner et al. |
| 2017/0263579 A1 | 9/2017 | Hu |
| 2020/0161266 A1* | 5/2020 | Shim .................. H01L 23/5386 |
| 2021/0202390 A1* | 7/2021 | Hsu ....................... H01L 21/565 |

FOREIGN PATENT DOCUMENTS

| | | |
|---|---|---|
| CN | 111211107 | 5/2020 |
| TW | 201931531 | 8/2019 |

OTHER PUBLICATIONS

"Office Action of China Counterpart Application", dated Oct. 10, 2022, p. 1-p. 10.

* cited by examiner

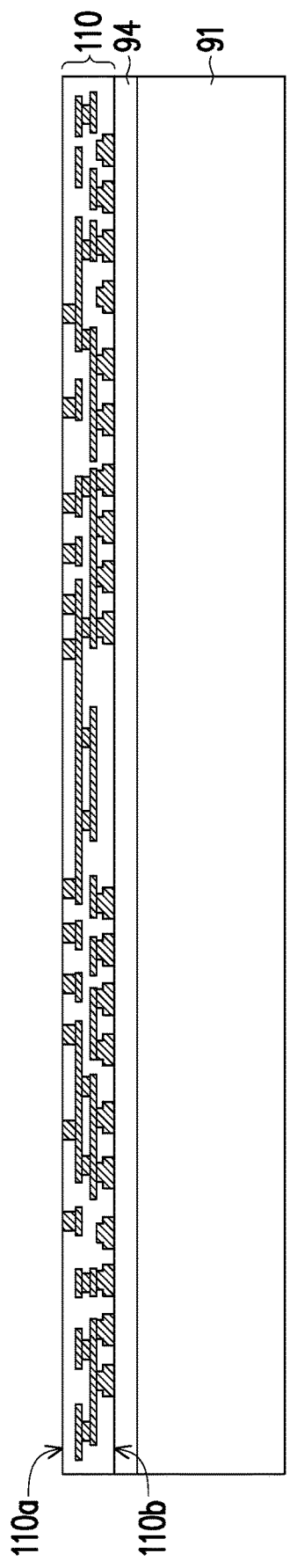
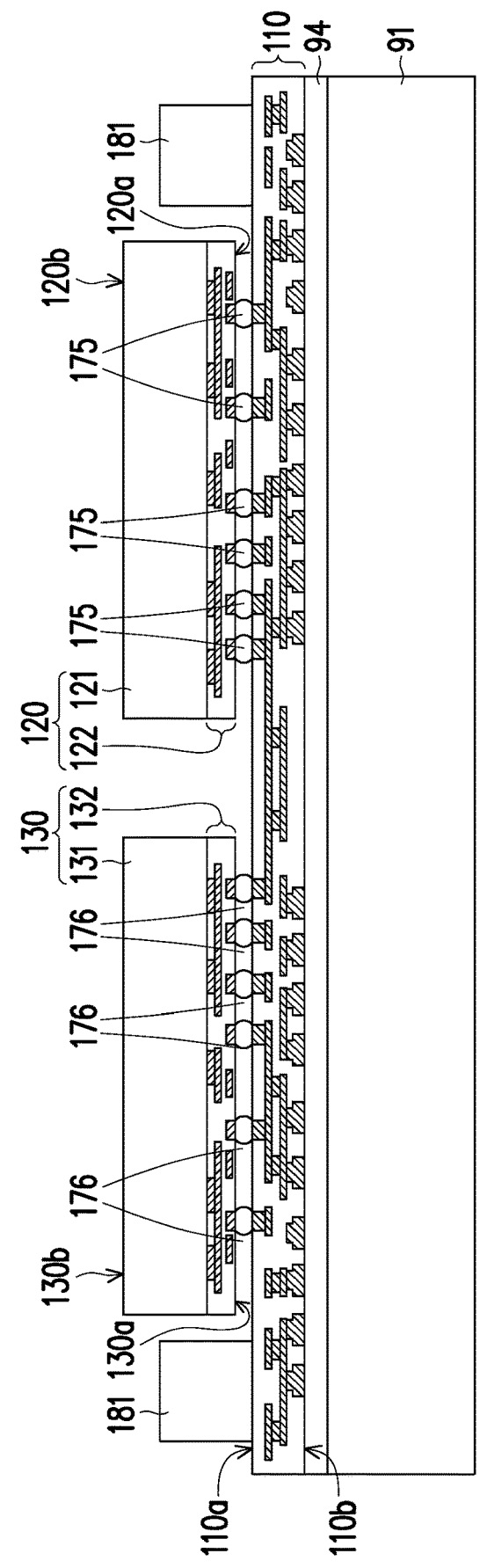
FIG. 1A
FIG. 1B

PACKAGE STRUCTURE AND MANUFACTURING METHOD THEREOF

CROSS-REFERENCE TO RELATED APPLICATION

This application claims the priority benefit of U.S. provisional application Ser. No. 62/955,456, filed on Dec. 31, 2019. The entirety of the above-mentioned patent application is hereby incorporated by reference herein and made a part of this specification.

BACKGROUND

Technical Field

The disclosure relates to a package structure and a manufacturing method thereof, and particularly relates to a package structure having a plurality of chips and a plurality of circuit boards and a manufacturing method thereof.

Description of Related Art

In recent years, electronic apparatuses play a more and more important role in our daily life. To facilitate the integration of various functions, a plurality of active chips may be integrated in a package structure. Therefore, how to facilitate the yield rate or quality of a package structure having a plurality of active devices or how to reduce the manufacturing cost of a package structure having a plurality of active devices has now become an issue to work on.

SUMMARY

The disclosure provides a package structure with favorable quality.

The disclosure provides a manufacturing method of a package structure rendering a favorable yield rate or a low manufacturing cost.

A package structure according to the disclosure includes a redistribution circuit structure, a first chip, a second chip, a first circuit board, a second circuit board, and a plurality of conductive terminals. The redistribution circuit structure has a first connection surface and a second connection surface opposite to the first connection surface. The first chip is disposed on the first connection surface and electrically connected to the redistribution circuit structure. The second chip is disposed on the first connection surface and electrically connected to the redistribution circuit structure. The first circuit board is disposed on the second connection surface and electrically connected to the redistribution circuit structure. The second circuit board is disposed on the second connection surface and electrically connected to the redistribution circuit structure. The conductive terminals are disposed on the first circuit board or the second circuit board. The conductive terminals are electrically connected to the first circuit board or the second circuit board.

A manufacturing method of a package structure according to the disclosure includes: forming a redistribution circuit structure having a first connection surface and a second connection surface opposite to the first connection surface; disposing a first chip on the first connection surface, and electrically connecting the first chip to the redistribution circuit structure; disposing a second chip on the first connection surface, and electrically connecting the second chip to the redistribution circuit structure; disposing a first circuit board on the second connection surface, and electrically connecting the first circuit board to the redistribution circuit structure; disposing a second circuit board on the second connection surface, and electrically connecting the second circuit board to the redistribution circuit structure; and disposing a plurality of conductive terminals on the first circuit board or the second circuit board and electrically connecting the conductive terminals to the first circuit board or the second circuit board.

Based on the above, in the package structure having a plurality of chips, by disposing a plurality of circuit boards on the redistribution circuit structure, the manufacturing method of the package structure can be simple, and/or the cost can be reduced. In addition, for the overall circuit layout of the package structure, the load of the redistribution circuit structure can be reduced. Therefore, the quality of the package structure can be facilitated.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIGS. 1A to 1F are schematic partial cross-sectional views illustrating a part of a manufacturing method of a package structure according to a first embodiment of the disclosure.

DESCRIPTION OF THE EMBODIMENTS

Figure 1C:
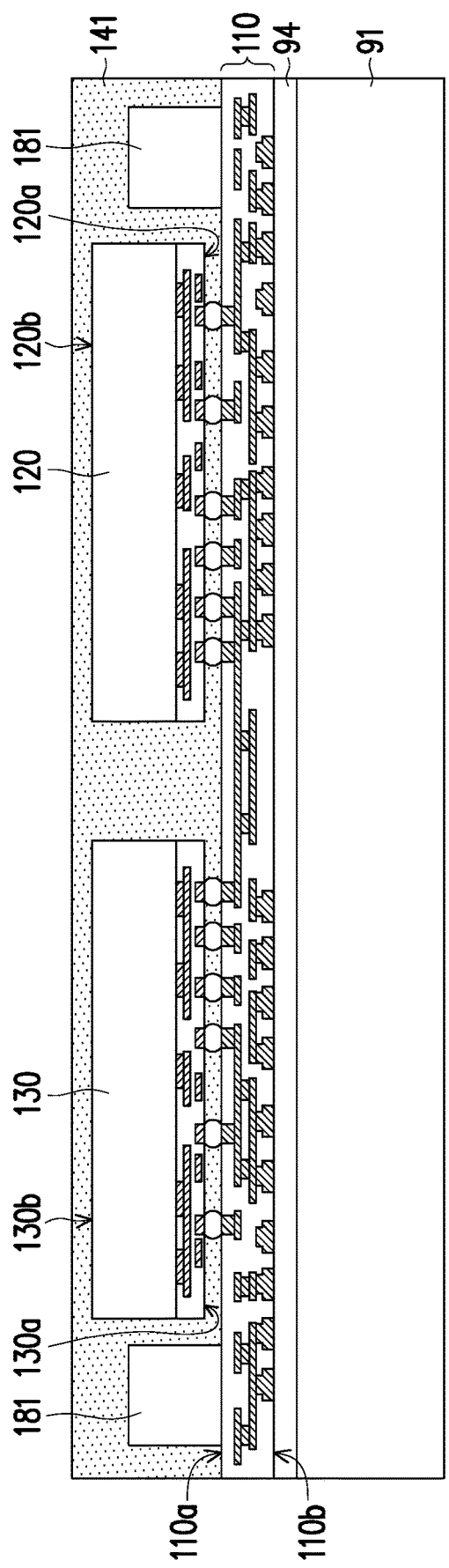

Reference will now be made in detail to the exemplary embodiments of the disclosure, examples of which are illustrated in the accompanying drawings. Wherever possible, the same reference numbers are used in the drawings and the description to refer to the same or like parts.

The directional terms (e.g., upper, lower, right, left, front, rear, top portion, bottom portion, etc.) used herein merely serve as the reference for the drawings and are not intended to imply absolute orientation. Also, for clear illustration, some layers or components are omitted in the drawings.

Unless otherwise specified, the steps in any method described in the disclosure shall not be construed as requiring to be executed in a specific order.

The drawings of the embodiments serve as reference to more comprehensively describe the disclosure. Nevertheless, the disclosure may be implemented in various forms and shall not be limited to the embodiments described herein. For the purpose of clear illustration, the thickness, size, or dimension of some layers or regions in the drawings may be enlarged. Like or similar reference symbols represent like or similar components, and the same details will not be repetitively described.

FIGS. 1A to 1F are schematic partial cross-sectional views illustrating a part of a manufacturing method of a package structure according to a first embodiment of the disclosure. FIG. 1G is a schematic top view illustrating a portion of the package structure according to the first embodiment of the disclosure.

Referring to FIG. 1A, a redistribution circuit structure 110 is formed. For example, the redistribution circuit structure 110 may be formed on a first carrier plate 91 by performing a conventional semiconductor process. The first carrier plate 91 may be formed by glass, a wafer substrate, metal, or other suitable materials, as long as such material is capable of carrying a structure or a component formed thereon in subsequent processes.

In the embodiment, the redistribution circuit structure 110 may have a first connection surface 110a and a second connection surface 110b. The second connection surface 110b is opposite to the first connection surface 110a, and the second connection surface 110b faces the first carrier plate 91.

In the embodiment, a release layer 94 may be provided on the first carrier plate 91. The release layer 94 may be a light to heat conversion (LTHC) adhesive layer. However, the disclosure is not limited thereto.

Referring to FIG. 1B, a first chip 120 is disposed on the first connection surface 110a of the redistribution circuit structure 110, and the first chip 120 is electrically connected to a corresponding circuit in the redistribution circuit structure 110.

In the embodiment, the first chip 120 may include a base 121 and a circuit structure 122. A device region (not shown) is provided on a side of the base 121. The surface of the first chip 120 on which the device region is located may be referred to as an active surface 120a. The circuit structure 122 may be located on the active surface 120a. In the conventional chip design, the device in the device region (e.g., the device in the device region of the first chip 120) may be electrically connected to a corresponding circuit in the circuit structure 122 through a corresponding back end of line (BEOL) interconnect.

In the embodiment, the active surface 120a (also referred to as first active surface 120a) of the first chip 120 may face the first connection surface 110a of the redistribution circuit structure 110. The first chip 120 may be electrically connected to a corresponding circuit in the redistribution circuit structure 110 through a corresponding first chip connector 175.

In an embodiment, the first chip connector 175 may include a conductive pillar, a solder ball, a conductive bump, or a conductive connector in other forms or shapes. The first chip connector 175 may be formed by plating, deposition, ball placement, reflow, and/or other suitable processes.

As an example, only one first chip 120 is shown in FIG. 1B. However, the disclosure is not limited thereto. In an embodiment not shown herein, there may be multiple first chips 120 disposed on the first connection surface 110a.

Referring to FIG. 1B, a second chip 130 is disposed on the first connection surface 110a of the redistribution circuit structure 110, and the second chip 130 is electrically connected to a corresponding circuit in the redistribution circuit structure 110.

In the embodiment, the second chip 130 may include a base 131 and a circuit structure 132. A device region (not shown) is provided on a side of the base 131. The surface of the second chip 130 on which the device region is located may be referred to as an active surface 130a. The circuit structure 132 may be located on the active surface 130a. In the conventional chip design, the device in the device region (e.g., the device in the device region of the second chip 130) may be electrically connected to a corresponding circuit in the circuit structure 132 through the corresponding back end of line (BEOL) interconnect.

In the embodiment, the active surface 130a (also referred to as second active surface 130a) of the second chip 130 may face the first connection surface 110a of the redistribution circuit structure 110. The second chip 130 may be electrically connected to a corresponding circuit in the redistribution circuit structure 110 through a corresponding second chip connector 176.

In an embodiment, the second chip connector 176 may include a conductive pillar, a solder ball, a conductive bump, or a conductive connector in other forms or shapes. The second chip connector 176 may be formed by plating, deposition, ball placement, reflow, and/or other suitable processes.

As an example, only one second chip 130 is shown in FIG. 1B. However, the disclosure is not limited thereto. In an embodiment not shown herein, there may be multiple second chips 130 disposed on the first connection surface 110a.

Referring to FIG. 1B, in the embodiment, a stiffening support member 181 may be disposed on the first connection surface 110a of the redistribution circuit structure 110. The stiffening support member 181 may be directly or indirectly connected to the redistribution circuit structure 110. For example, the stiffening support member 181 may be embedded into the redistribution circuit structure 110, so that the stiffening support member 181 is directly connected to the redistribution circuit structure 110. As another example, an adhesive material may be provided between the stiffening support member 181 and the redistribution circuit structure 110, so that the stiffening support member 181 is indirectly connected to the redistribution circuit structure 110.

In an embodiment, the stiffening support member 181 may include a support die. For example, an ugly die, a failed die, or other similar dummy dies may serve as the support die. In this way, the manufacturing cost can be reduced.

In an embodiment, the stiffening support member 181 may include a rigid support ring. For example, the stiffening support member 181 may include a ring-shaped metal bar.

In an embodiment, the stiffening support member 181 may be electrically isolated from the redistribution circuit structure 110. In other words, the stiffening support member 181 may not be electrically connected to the redistribution circuit structure 110.

It is noted that the disclosure does not limit the order in which the first chip 120, the second chip 130, and/or the stiffening support member 181 (if provided) are disposed.

In an embodiment, in a subsequent process or structure, the stiffening support member 181 may reduce the warpage of the structure.

In an embodiment, the first chip 120 and/or the second chip 130 disposed on the redistribution circuit structure 110 may be known good dies (KGDs). For example, before the first chip 120 and/or the second chip 130 are disposed on the redistribution circuit structure 110, an electrical property test (e.g., open/short test, i.e., 0/S test), an appearance test (e.g., auto optical inspection (AOI)), or other suitable checks or test processes may be carried out for the first chip 120 and/or the second chip 130. In this way, whether the first chip 120 and/or the second chip 130 disposed on the redistribution circuit structure 110 function favorably can be determined, and the yield rate of the package structure 100 (as shown in FIG. 1F or 1G) can be facilitated.

Referring to FIG. 1C, in the embodiment, a first encapsulant 141 covering the first chip 120 and the second chip 130 may be formed. In an embodiment, a melt molding compound is formed on the first connection surface 110a of the redistribution circuit structure 110 by performing a molding process or other suitable processes, for example. The, the melt molding compound is cooled off and cured to form the first encapsulant 141.

In the embodiment, a back surface 120b (i.e., the surface opposite to the active surface 120a, which is also referred to as a first back surface 120b) of the first chip 120 and a back surface 130b (i.e., the surface opposite to the active surface 130a, which is also referred to as a second back surface 130b) of the second chip 130 are not exposed by the first encapsulant 141. However, the disclosure is not limited thereto. In an embodiment, the back surface 120b of the first chip 120 or the back surface 130b of the second chip 130 may be exposed by performing a chemical mechanical polishing (CMP) process, a mechanical grinding process, an etching process, or other suitable thinning processes.

In the embodiment, the first encapsulant 141 may further cover the stiffening support member 181. However, the disclosure is not limited thereto.

Figure 1D:
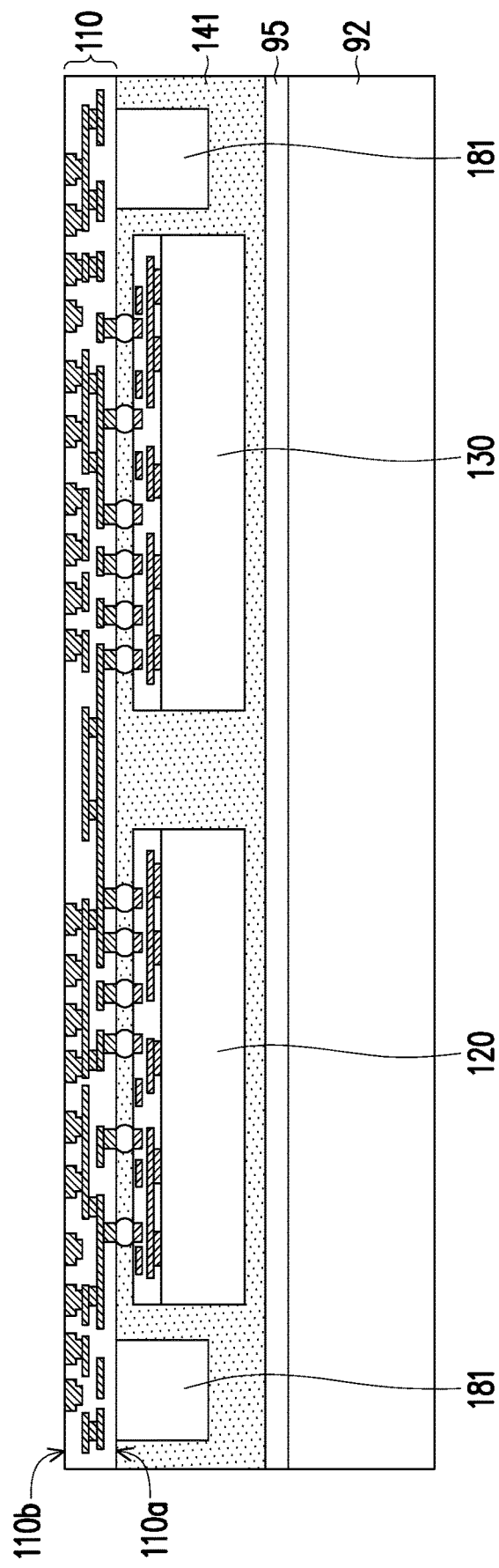

Referring to FIGS. 1C to 1D, after the first encapsulant 141 is formed, the structure on the first carrier plate 91 (shown in FIG. 1C) may be transferred to a second carrier plate 92 (shown in FIG. 1D) via a conventional carrier transfer bonding process. In addition, the first carrier plate 91 may be removed to expose the second connection surface 110b of the redistribution circuit structure 110. The second carrier plate 92 may be formed by glass, a wafer substrate, metal, or other suitable materials, as long as such material is capable of carrying a structure or a component formed thereon in subsequent processes.

In the embodiment, a release layer 95 may be provided on the second carrier plate 92. The release layer 95 may be a light to heat conversion (LTHC) adhesive layer. However, the disclosure is not limited thereto.

Figure 1E:
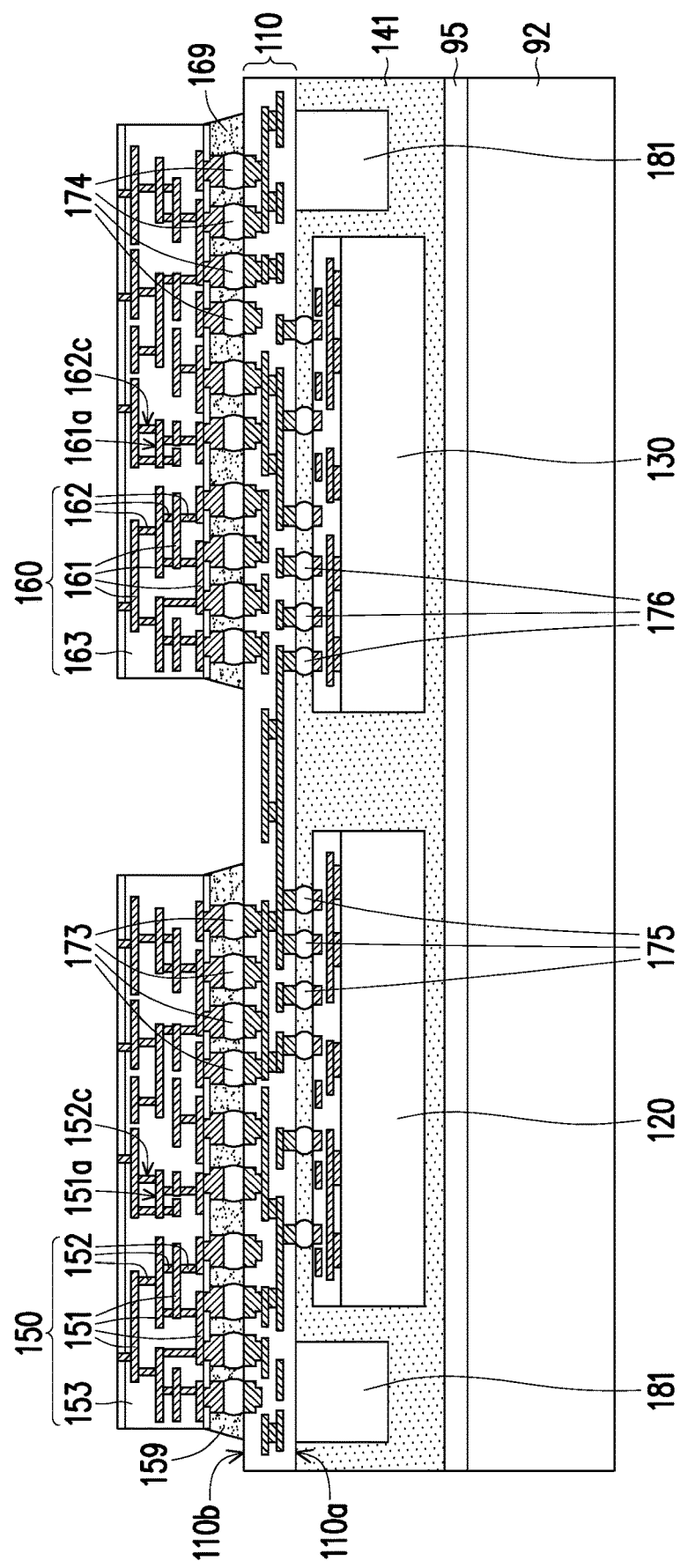
Figure 1F:
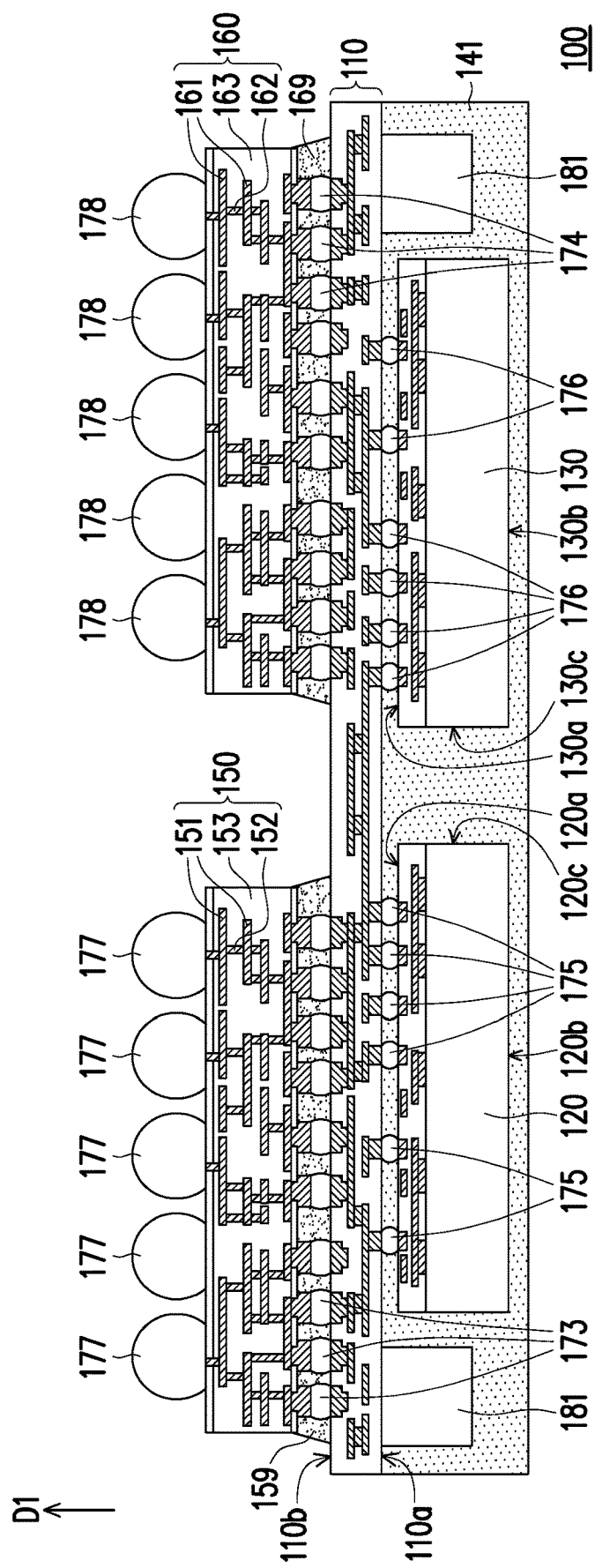
Figure 1G:
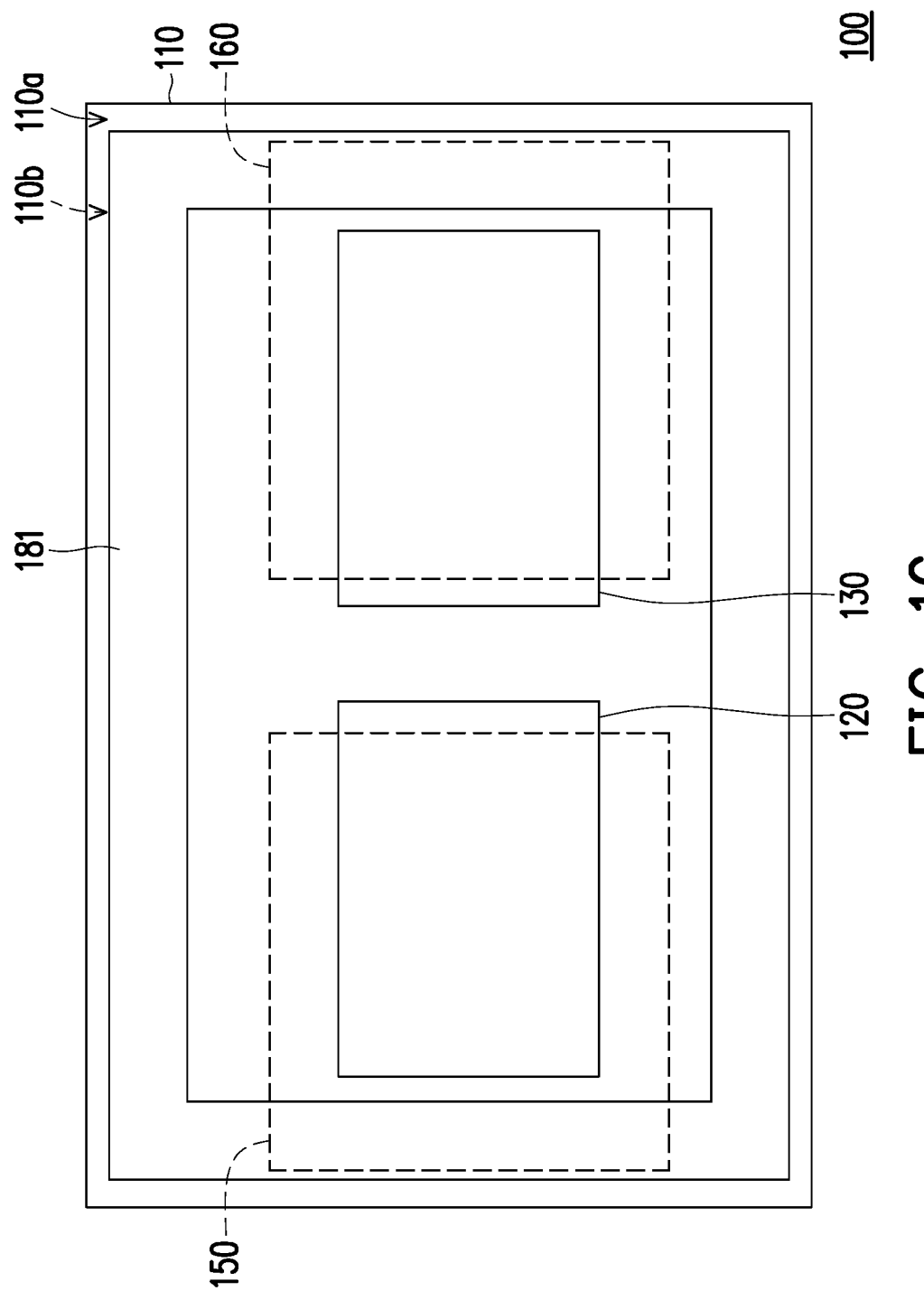
FIG. 1G is a schematic top view illustrating a portion of the package structure according to the first embodiment of the disclosure.

Referring to FIG. 1E, a first circuit board 150 is disposed on the second connection surface 110b of the redistribution circuit structure 110 and electrically connected to a corresponding circuit in the redistribution circuit structure 110.

In the embodiment, the first circuit board 150 may be a Si-substrate-free circuit board. For example, an insulating material 153 in the first circuit board 150 may include an epoxy prepreg sheet, an aramid prepreg sheet, or other similar polymer prepreg sheets.

In an embodiment, the first circuit board 150 may include a plurality of circuit layers 151 and conductive microvias between the circuit layers 151. In an embodiment, a sidewall 152c of the conductive microvia 152 is substantially perpendicular to a surface 151a of the circuit layer 151 to which the conductive microvia 152 is connected.

In an embodiment, the first circuit board 150 may be a high density interconnect (HDI) substrate.

In the embodiment, the first circuit board 150 may be electrically connected to a corresponding circuit in the redistribution circuit structure 110 through a corresponding third conductive connector 173.

In an embodiment, the third conductive connector 173 may include a conductive pillar, a solder ball, a conductive bump, or a conductive connector in other forms or shapes. The third conductive connector 173 may be formed by plating, deposition, ball placement, reflow, and/or other suitable processes and be disposed on the first circuit board 150.

In the embodiment, a filling layer 159 may be formed between the first circuit board 150 and the redistribution circuit structure 110. However, the disclosure is not limited thereto. The filling layer 159 includes, for example, a capillary underfill (CUF) or other suitable filling materials. However, the disclosure is not limited thereto.

As an example, only one first circuit board 150 is shown in FIG. 1E. However, the disclosure is not limited thereto. In an embodiment not shown herein, there may be multiple first circuit boards 150 disposed on the second connection surface 110b.

Referring to FIG. 1E, a second circuit board 160 is disposed on the second connection surface 110b of the redistribution circuit structure 110 and electrically connected to a corresponding circuit in the redistribution circuit structure 110.

In the embodiment, the second circuit board 160 may be a Si-substrate-free circuit board. For example, an insulating material 163 in the second circuit board 160 may include an epoxy prepreg sheet, an aramid prepreg sheet, or other similar polymer prepreg sheets.

In an embodiment, the second circuit board 160 may include a plurality of circuit layers 161 and conductive microvias between the circuit layers 161. In an embodiment, a sidewall 162c of the conductive microvia 162 is substantially perpendicular to a surface 161a of the circuit layer 161 to which the conductive microvia 162 is connected.

In an embodiment, the second circuit board 160 may be a high density interconnect (HDI) substrate.

In the embodiment, the second circuit board 160 may be electrically connected to a corresponding circuit in the redistribution circuit structure 110 through a corresponding fourth conductive connector 174.

In an embodiment, the fourth conductive connector 174 may include a conductive pillar, a solder ball, a conductive bump, or a conductive connector in other forms or shapes. The fourth conductive connector 174 may be formed by plating, deposition, ball placement, reflow, and/or other suitable processes and be disposed on the second circuit board 160.

In the embodiment, a filling layer 169 may be formed between the second circuit board 160 and the redistribution circuit structure 110. However, the disclosure is not limited thereto. The filling layer 169 includes, for example, a capillary underfill (CUF) or other suitable filling materials. However, the disclosure is not limited thereto.

As an example, only one second circuit board 160 is shown in FIG. 1E. However, the disclosure is not limited thereto. In an embodiment not shown herein, there may be multiple second circuit boards 160 disposed on the second connection surface 110b.

It is noted that the disclosure does not limit the order in which the first circuit board 150 and the second circuit board 160 are disposed.

In an embodiment, before the first circuit board 150 and the second circuit board 160 are disposed on the redistribution circuit structure 110, an electrical property test (e.g., open/short test, i.e., 0/S test), an appearance test (e.g., auto optical inspection (AOI)), or other suitable checks or test processes may be carried out for the redistribution circuit structure 110. In this way, whether the redistribution circuit structure 110, the first chip 120 electrically connected to the redistribution circuit structure 110, and the second chip 130 electrically connected to the redistribution circuit structure 110 function favorably can be determined, and the yield rate of the package structure 100 (shown in FIG. 1F or 1G) can be facilitated.

In an embodiment, the first circuit board 150 and/or the second circuit board 160 disposed on the redistribution circuit structure 110 may be known good substrates (KGSs). For example, before the first circuit board 150 and/or the second circuit board 160 are disposed on the redistribution circuit structure 110, an electrical property test (e.g., open/short test, i.e., 0/S test), an appearance test (e.g., auto optical inspection (AOI)), or other suitable checks or test processes may be carried out for the first circuit board 150 and/or the second circuit board 160. In this way, whether the first circuit board 150 and/or the second circuit board 160 disposed on the redistribution circuit structure 110 function favorably can be determined, and the yield rate of the package structure 100 (as shown in FIG. 1F or 1G) can be facilitated.

In an embodiment, after the circuit board (e.g., at least one of the first circuit board 150 and the second circuit board 160) is disposed on the redistribution circuit structure 110, an electrical property test (e.g., open/short test, i.e., 0/S test), an appearance test (e.g., auto optical inspection (AOI)), or other suitable checks or test processes may be carried out for the circuit board. In an embodiment, if the circuit board needs to be checked or tested again, re-worked, and/or scarped after the check or test process is carried out, since the circuit boards (e.g., the first circuit board 150 and the second circuit board 160) are disposed on the redistribution circuit structure 110, the process can be simple, and/or the cost can be reduced.

Referring to FIG. 1F, a first conductive terminal 177 is disposed on the first circuit board 150, and the first conductive terminal 177 is electrically connected to a corresponding circuit in the first circuit board 150.

Referring to FIG. 1F, a second conductive terminal 178 is disposed on the second circuit board 160, and the second conductive terminal 178 is electrically connected to a corresponding circuit in the second circuit board 160.

In the embodiment, the first conductive terminal 177 or the second conductive terminal 178 may include a solder ball or a conductive connector in other forms or shapes. The first conductive terminal 177 or the second conductive terminal 178 may be formed by ball placement, reflow, and/or other suitable processes.

It is noted that the disclosure does not limit the order in which the first conductive terminal 177 and the second conductive terminal 178 are disposed.

In an embodiment, after the first conductive terminal 177 is disposed or the second conductive terminal 178 is disposed, the second carrier plate 92 may be removed. However, the disclosure is not limited thereto.

After the above processes, the package structure 100 of the embodiment is substantially manufactured.

Referring to FIGS. 1F and 1G, the package structure 100 includes the redistribution circuit structure 110, the first chip 120, the second chip 130, the first circuit board 150, the second circuit board 160, and the conductive terminals 177 and 178. The redistribution circuit structure 110 has the first connection surface 110a and the second connection surface 110b. The second connection surface 110b is opposite to the first connection surface 110a. The first chip 120 is disposed on the first connection surface 110a of the redistribution circuit structure 110 and electrically connected to the redistribution circuit structure 110. The second chip 130 is disposed on the first connection surface 110a of the redistribution circuit structure 110 and electrically connected to the redistribution circuit structure 110. The first circuit board 150 is disposed on the second connection surface 110b of the redistribution circuit structure 110 and electrically connected to the redistribution circuit structure 110. The second circuit board 160 is disposed on the second connection surface 110b of the redistribution circuit structure 110 and electrically connected to the redistribution circuit structure 110. The conductive terminals 177 and 178 may include the first conductive terminal 177 or the second conductive terminal 178. The first conductive terminal 177 may be disposed on the first circuit board 150 and electrically connected to the first circuit board 150. The second conductive terminal 178 may be disposed on the second circuit board 160 and electrically connected to the second circuit board 160.

In an embodiment, the first chip 120 or the second chip 130 may be a power management integrated circuit (PMIC), a micro-electro-mechanical system (MEMS), an application-specific integrated circuit (ASIC), a dynamic random access memory (DRAM), a static random access memory (SRAM), a high bandwidth memory (HBM), a system on chip (SoC), or other similar high performance computing (HPC) chips. However, the disclosure is not limited thereto.

In an embodiment, the first chip 120 and the second chip 130 may be homogeneous chips or heterogeneous chips. The disclosure is not particularly limited in this regard.

In the embodiment, the first connection surface 110a and the second connection surface 110b of the redistribution structure 110 are substantially parallel. However, the disclosure is not limited thereto.

In an embodiment, in a projection direction D1 (e.g., the direction shown in FIG. 1G) perpendicular to the first connection surface 110a or the second connection surface 110b, the first chip 120 and the second chip 130 are not overlapped. In an embodiment, the first chip 120 and the second chip 130 may be disposed side by side.

In the embodiment, in the projection direction D1 perpendicular to the first connection surface 110a or the second connection surface 110b, the first circuit board 150 and the second circuit board 160 are not overlapped. In an embodiment, the first circuit board 150 and the second circuit board 160 may be disposed side by side.

In the embodiment, in the projection direction D1 perpendicular to the first connection surface 110a or the second connection surface 110b, the first circuit board 150 and the second circuit board 160 are completely overlapped with the redistribution circuit structure 110.

In the embodiment, the package structure 100 may further include the stiffening support member 181. However, the disclosure is not limited thereto.

In the embodiment, the stiffening support member 181 may be ring-shaped. The first chip 120 and the second chip 130 are located in the ring-shaped stiffening support member 181.

In the embodiment, in the projection direction D1 perpendicular to the first connection surface 110a or the second connection surface 110b, the stiffening support member 181 may be overlapped with the first circuit board 150 or the second circuit board 160. For example, the stiffening support member 181 may be partially overlapped with the first circuit board 150 and the stiffening support member 181 may be partially overlapped with the second circuit board 160.

In the embodiment, the package structure 100 may further include the first encapsulant 141. However, the disclosure is not limited thereto.

In the embodiment, the first encapsulant 141 may encapsulate the first chip 120. In an embodiment, a portion of the first encapsulant 141 may be located between the first chip 120 and the redistribution circuit structure 110. In an embodiment, the first encapsulant 141 may cover the active surface 120a, the back surface 120b, and a side surface 120c (i.e., a surface connecting the active surface 120a and the back surface 120b) of the first chip 120.

In the embodiment, the package structure 100 may further include the first chip connector 175. The first chip connector 175 may be located between the first chip 120 and the redistribution circuit structure 110. In an embodiment, the first encapsulant 141 may further cover the first chip connector 175.

In the embodiment, the first encapsulant 141 may encapsulate the second chip 130. In an embodiment, a portion of the first encapsulant 141 may be located between the second chip 130 and the redistribution circuit structure 110. In an embodiment, the first encapsulant 141 may cover the active surface 130a, the back surface 130b, and a side surface 130c (i.e., a surface connecting the active surface 130a and the back surface 130b) of the second chip 130.

In the embodiment, the package structure 100 may further include the second chip connector 176. The second chip connector 176 may be located between the second chip 130 and the redistribution circuit structure 110. In an embodiment, the first encapsulant 141 may further cover the second chip connector 176.

According to the embodiment, in the package structure 100 having a plurality of chips (e.g., the first chip 120 and the second chip 130), power or signal transmission between the chips (e.g., between the first chip 120 and the second chip 130) needs to be carried out through a corresponding circuit, and the respective chips may require corresponding circuits to transmit power or signals to the outside. For example, the first chip 120 and the second chip may 130 transmit power or signals to external electronic components connected to the conductive terminals 177 and 178 through the corresponding conductive terminals 177 and 178. Therefore, by disposing a plurality of circuit boards (e.g., the first circuit board 150 and the second circuit board 160) on the redistribution circuit structure 110, the manufacturing method of the package structure 110 can be simple, and/or the cost can be reduced. In addition, for the overall circuit layout of the package structure 100, the load of the redistribution circuit structure 110 can be reduced (e.g., the number of conductive layers in the redistribution circuit structure 110 can be reduced, the line width, the line spacing, and/or the circuit layout of the conductive layers of the redistribution circuit structure 110 can be easily optimized). Accordingly, the quality of the package structure 100 can be facilitated.

Figure 2A:
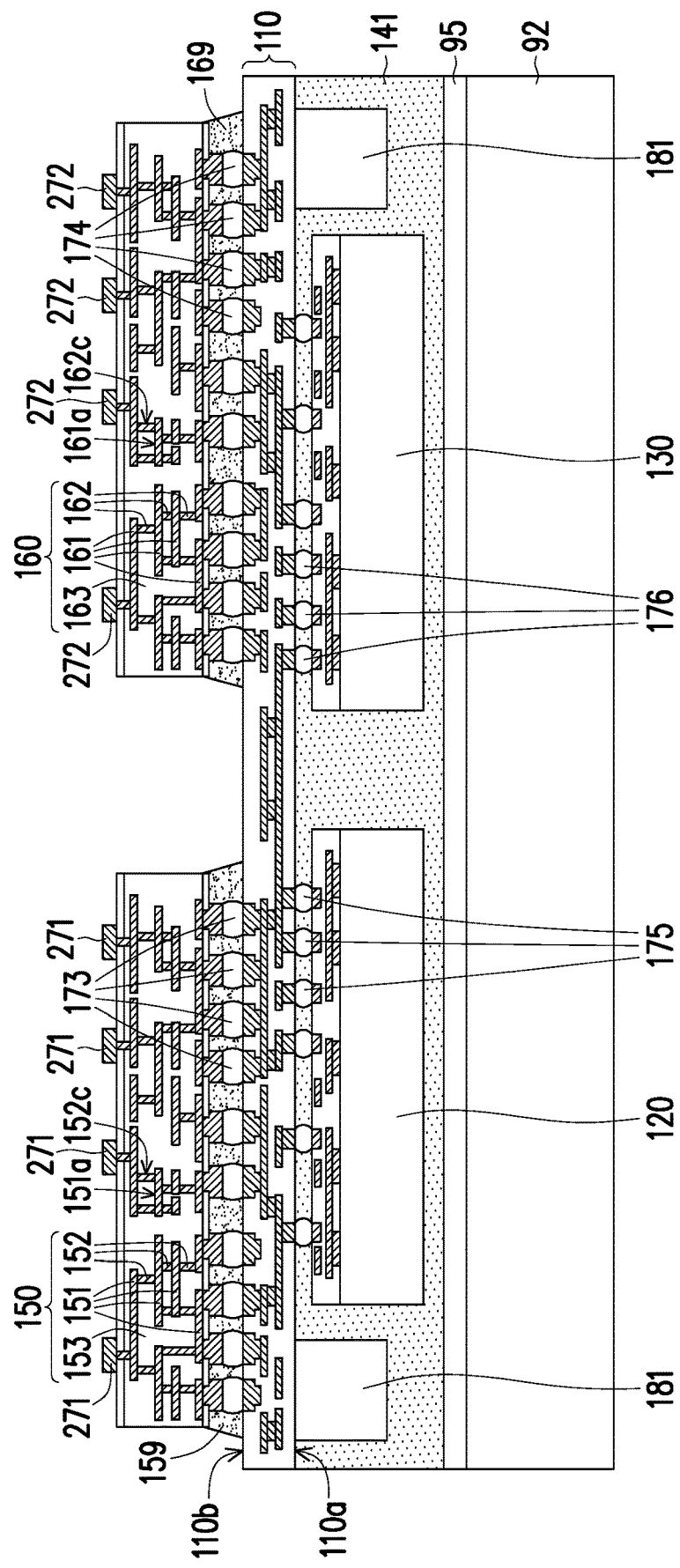
FIGS. 2A to 2C are schematic partial cross-sectional views illustrating a part of a manufacturing method of a package structure according to a second embodiment of the disclosure.
Figure 2B:
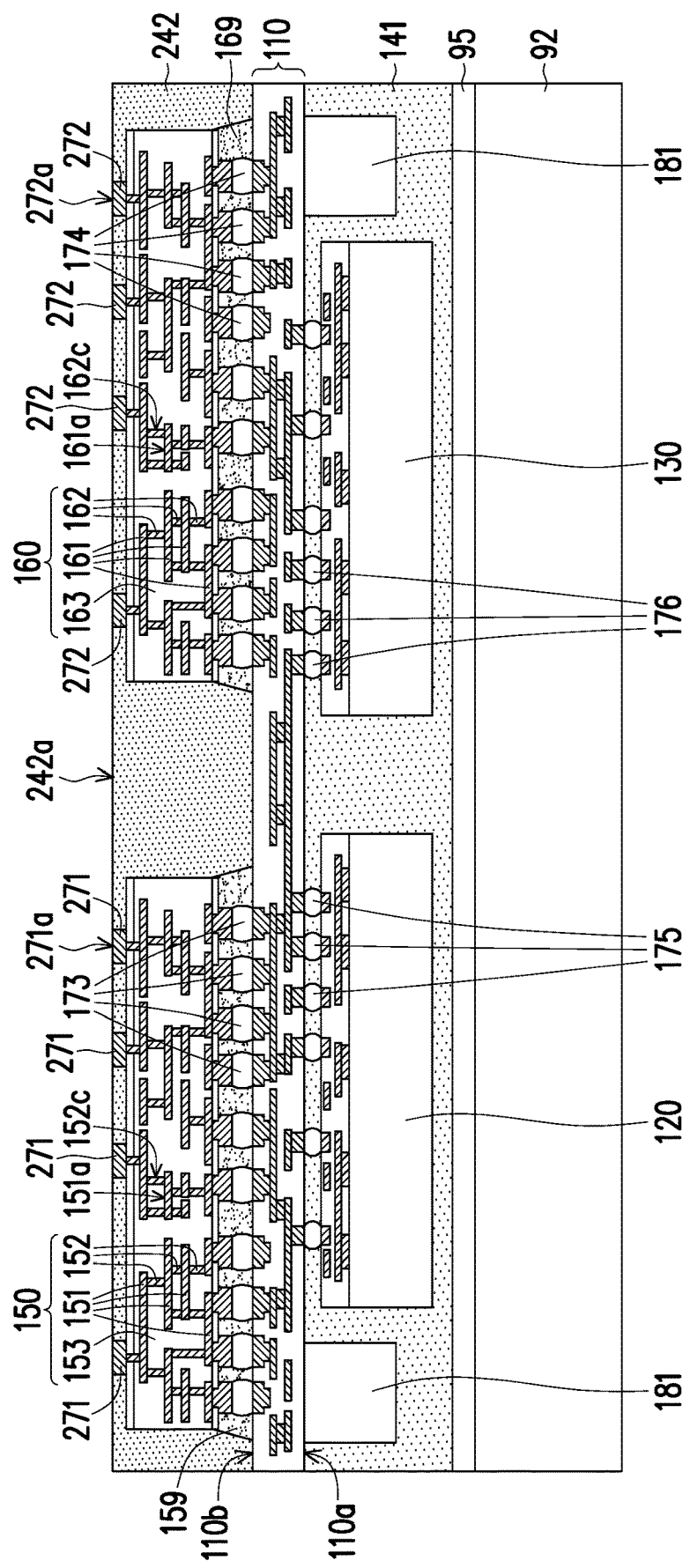
Figure 2C:
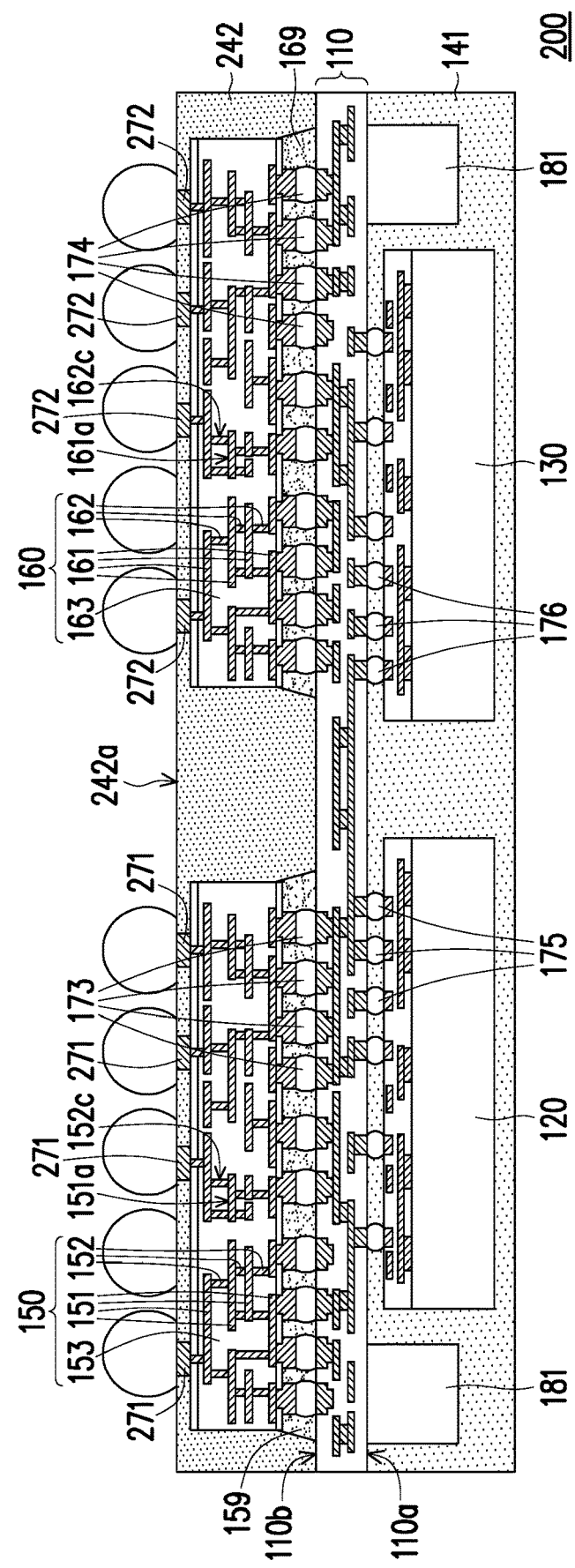

FIGS. 2A to 2C are schematic partial cross-sectional views illustrating a part of a manufacturing method of a package structure according to a second embodiment of the disclosure. The manufacturing method of a package structure 200 of the second embodiment is similar to the manufacturing method of the package structure 100 of the first embodiment. Therefore, similar components are represented by like symbols, have similar functions, and formed by similar materials or processes, and the same descriptions will not be repeated in the following. For example, FIG. 2A may be a schematic cross-sectional view illustrating the manufacturing method of the package structure after the step of FIG. 1E.

After FIG. 1E, referring to FIG. 2A, a plurality of first conductive connectors 271 may be disposed on the first circuit board 150 in the embodiment. The first conductive connector 271 may be electrically connected to a corresponding circuit in the first circuit board 150.

In an embodiment, the first conductive connector 271 may include a pre-formed conductor. For example, the first conductive connector 271 may include a pre-formed conductive pillar. However, the disclosure is not limited thereto.

Referring to FIG. 2A, in the embodiment, a plurality of second conductive connectors 272 are disposed on the second circuit 160. The second conductive connector 272 may be electrically connected to a corresponding circuit in the second circuit board 160.

In an embodiment, the second conductive connector 272 may include a pre-formed conductor. For example, the second conductive connector 272 may include a pre-formed conductive pillar. However, the disclosure is not limited thereto.

It is noted that the disclosure does not limit the order in which the first conductive connector 271 and the second conductive connector 272 are disposed.

Referring to FIG. 2B, a second encapsulant 242 may be formed on the second connection surface 110b of the redistribution circuit structure 110. The second encapsulant 242 may encapsulate the first circuit board 150 and the second circuit board 160, and the second encapsulant 242 may expose the first conductive connectors 271 and the second conductive connectors 272.

For example, a second encapsulant material covering the first circuit board 150 and the second circuit board 160 may be formed. In an embodiment, the second encapsulant material may be, for example, a melt molding compound formed on the second connection surface 110b of the redistribution circuit structure 110 by performing a molding process or other suitable processes, for example. The, the melt molding compound is cooled off and cured. Then, after the second encapsulant material is formed, a thinning process may be performed to remove a portion of the second encapsulant material and thus expose the first conductive connectors 271 and the second conductive connectors 272. The thinning process includes, for example, a chemical mechanical polishing process, a mechanical polishing process, an etching process, or other suitable processes. However, the disclosure is not limited thereto.

In the embodiment, the second encapsulant 242 at least laterally covers the first circuit board 150 and the second circuit board 160. In an embodiment, the second encapsulant 242 at least directly contacts the side surface of the first circuit board 150 and the side surface of the second circuit board 160. In an embodiment, a portion of the second encapsulant 242 is located between the first circuit board 150 and the second circuit board 160.

In an embodiment, an encapsulant top surface 242a of the second encapsulant 242, first conductive top surfaces 271a of the first conductive connectors 271, and second conductive top surfaces 272a of the second conductive connectors 272 are substantially coplanar.

Referring to FIG. 2C, the first conductive terminal 177 is disposed on the first circuit board 150, and the second conductive terminal 178 is disposed on the second circuit board 160. The first conductive terminal 177 may be electrically connected to a corresponding circuit in the first circuit board 150 via the first conductive connector 271. The second conductive terminal 178 may be electrically connected to a corresponding circuit in the second circuit board 160 via the second conductive connector 272.

After the above processes, the package structure 200 of the embodiment is substantially manufactured.

Referring to FIG. 2C, the package structure 100 may include the redistribution circuit structure 110, the first chip 120, the second chip 130, the first circuit board 150, the second circuit board 160, the conductive terminals 177 and 178, the first encapsulant 141, the second encapsulant 242, the first conductive connectors 271, and the second conductive connectors 272. The second encapsulant 242 encapsulates the first circuit board 150 and the second circuit board 160. The first conductive connector 271 may be located between the first circuit board 150 and the first conductive terminal 177. The second conductive connector 272 may be located between the second circuit board 160 and the second conductive terminal 178.

FIGS. 3A to 3F are schematic partial cross-sectional views illustrating a part of a manufacturing method of a package structure 300 according to a third embodiment of the disclosure. The manufacturing method of the package structure 300 of the third embodiment is similar to the manufacturing method of the package structure 100 of the first embodiment or the manufacturing method of the package structure 200 of the second embodiment. Therefore, similar components are represented by like symbols, have similar functions, and formed by similar materials or processes, and the same descriptions will not be repeated in the following.

Figure 3A:
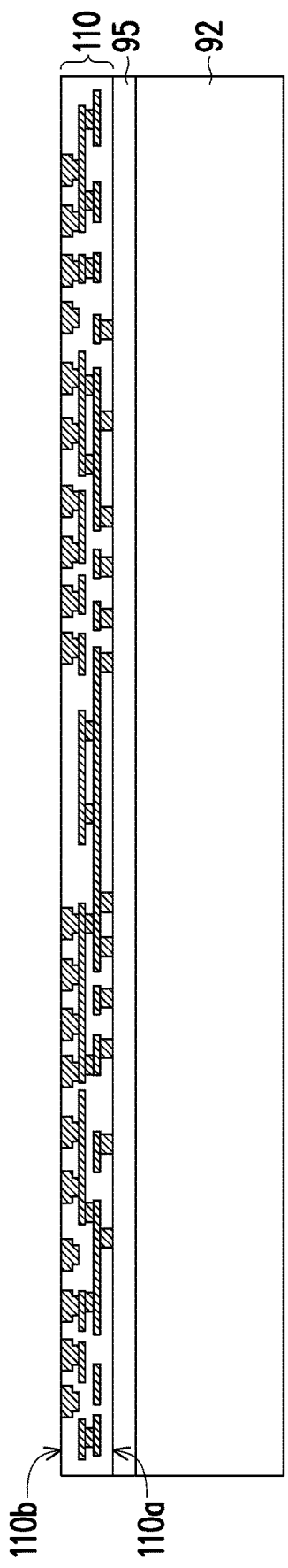
FIGS. 3A to 3F are schematic partial cross-sectional views illustrating a part of a manufacturing method of a package structure according to a third embodiment of the disclosure.

Referring to FIG. 3A, the redistribution circuit structure 110 is formed. For example, the redistribution circuit structure 110 may be formed on the second carrier plate 92 by performing a conventional semiconductor process. In addition, the first connection surface 110*a* faces the second carrier plate 92.

Figure 3B:
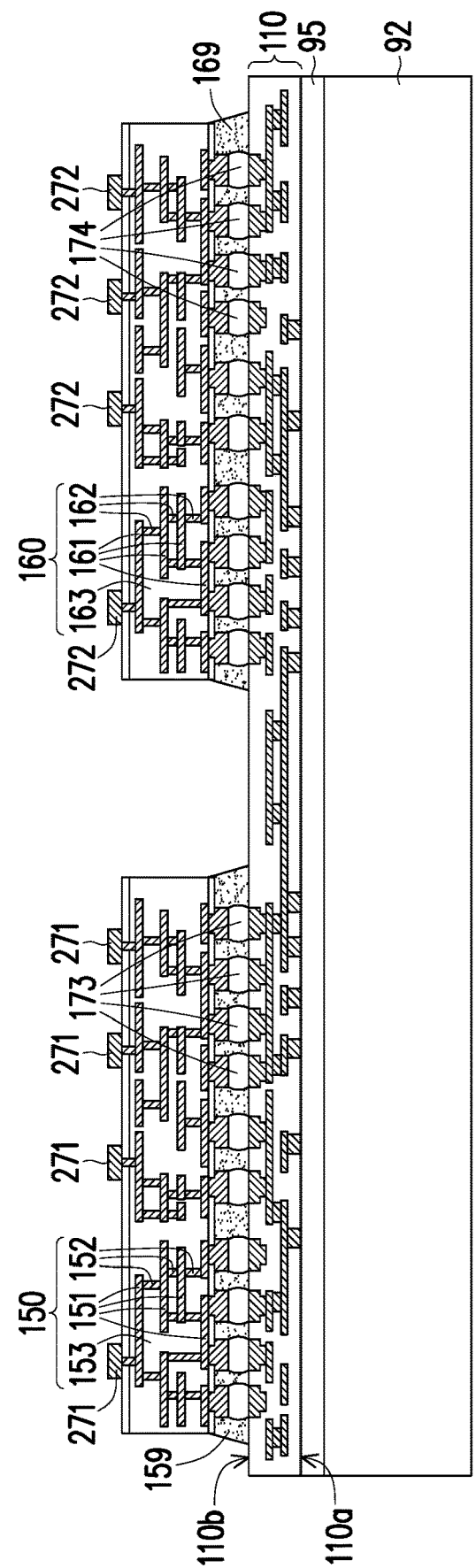

Referring to FIG. 3B, similar to the process shown in FIG. 1E, the first circuit board 150 is disposed on the second connection surface 110*b* of the redistribution circuit structure 110, and the second circuit board 160 is disposed on the second connection surface 110*b* of the redistribution circuit structure 110.

In the embodiment, the filling layer 159 may be formed between the first circuit board 150 and the redistribution circuit structure 110. However, the disclosure is not limited thereto.

In the embodiment, the filling layer 169 may be formed between the second circuit board 160 and the redistribution circuit structure 110. However, the disclosure is not limited thereto.

Referring to FIG. 3B, similar to the process shown in FIG. 2A, the first conductive connectors 271 may be disposed on the first circuit board 150, and/or the second conductive connectors 272 may be disposed on the second circuit board 160.

In an embodiment, the first circuit board 150 and/or the second circuit board 160 disposed on the redistribution circuit structure 110 may be known good substrates (KGSs). For example, before the first circuit board 150 and/or the second circuit board 160 are disposed on the redistribution circuit structure 110, an electrical property test (e.g., open/short test, i.e., 0/S test), an appearance test (e.g., auto optical inspection (AOI)), or other suitable checks or test processes may be carried out for the first circuit board 150 and/or the second circuit board 160. In this way, whether the first circuit board 150 and/or the second circuit board 160 disposed on the redistribution circuit structure 110 function favorably can be determined, and the yield rate of the package structure 300 (as shown in FIG. 3F) can be facilitated.

In an embodiment, after the circuit board (e.g., at least one of the first circuit board 150 and the second circuit board 160) is disposed on the redistribution circuit structure 110, an electrical property test (e.g., open/short test, i.e., 0/S test), an appearance test (e.g., auto optical inspection (AOI)), or other suitable checks or test processes may be carried out for the circuit board. In an embodiment, if the circuit board needs to be checked or tested again, re-worked, and/or scarped after the check or test process is carried out, since the boards (e.g., the first circuit board 150 and the second circuit board 160) are disposed on the redistribution circuit structure 110, the process can be simple, and/or the cost can be reduced.

Figure 3C:
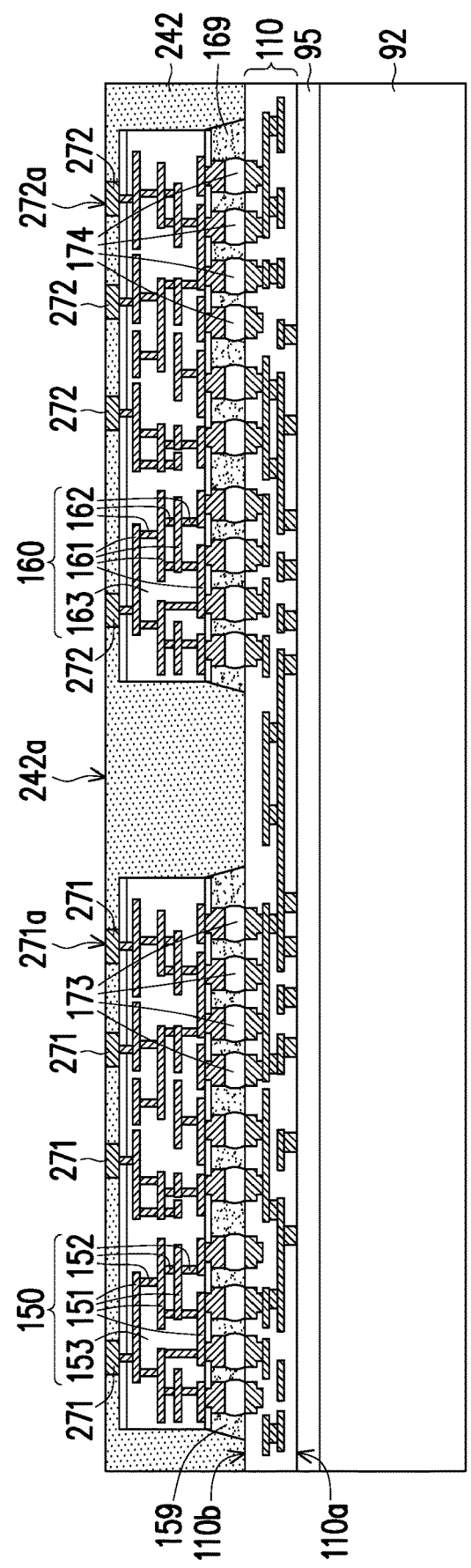

Referring to FIG. 3C, similar to the process shown in FIG. 2B, the second encapsulant 242 may be formed on the second connection surface 110*b* of the redistribution circuit structure 110.

Figure 3D:
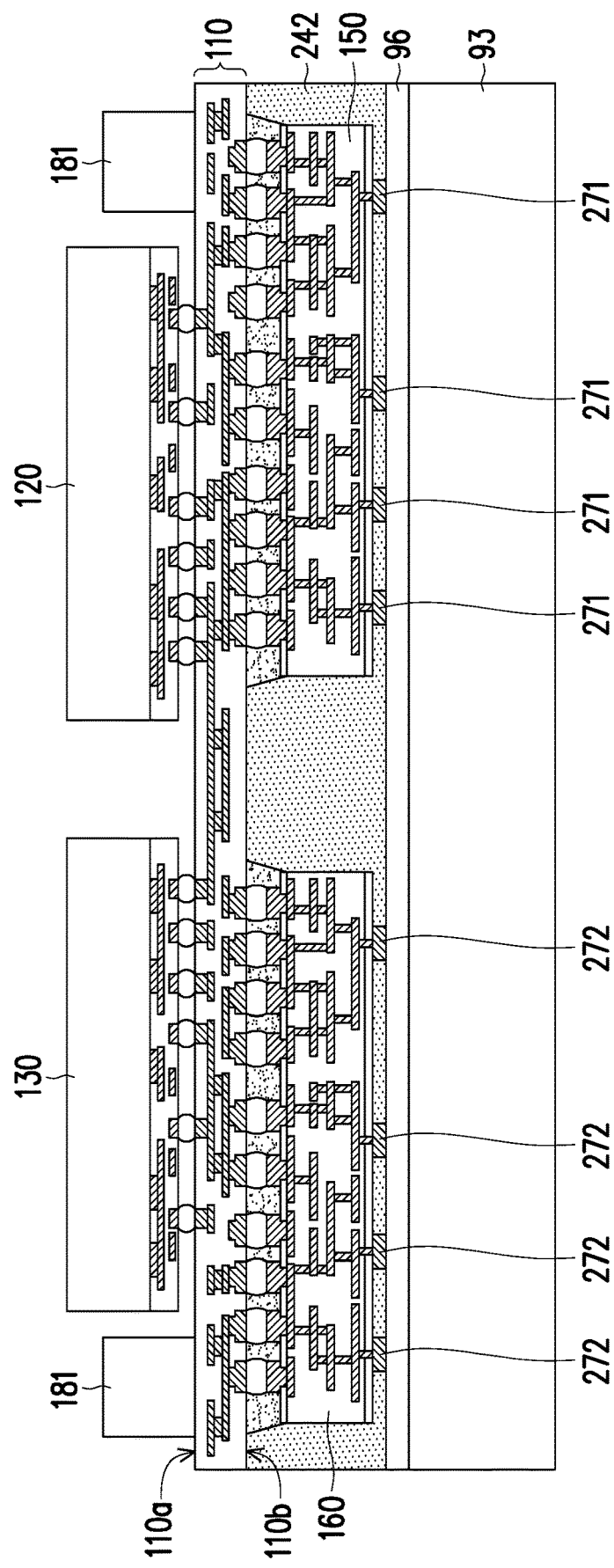

Referring to FIGS. 3C and 3D, after the second encapsulant 242 is formed, the structure on the second carrier plate 92 may be transferred to a third carrier plate 93 via a conventional carrier transfer bonding process. In addition, the second carrier plate 92 may be removed to expose the first connection surface 110*a* of the redistribution circuit structure 110. The third carrier plate 93 may be formed by glass, a wafer substrate, metal, or other suitable materials, as long as such material is capable of carrying a structure or a component formed thereon in subsequent processes.

In the embodiment, release layers 94, 95, and 96 may be provided on the third carrier plate 93. The release layers 94, 95, and 96 may be light to heat conversion (LTHC) adhesive layers. However, the disclosure is not limited thereto.

Referring to FIG. 3D, similar to the process shown in FIG. 1B, the first chip 120 is disposed on the first connection surface 110*a* of the redistribution circuit structure 110, and the second chip 130 is disposed on the first connection surface 110*a* of the redistribution circuit structure 110.

Referring to FIG. 3D, in the embodiment, the stiffening support member 181 may be disposed on the first connection surface 110*a* of the redistribution circuit structure 110.

In an embodiment, before the first chip 120 and the second chip 130 are disposed on the redistribution circuit structure 110, an electrical property test (e.g., open/short test, i.e., 0/S test), an appearance test (e.g., auto optical inspection (AOI)), or other suitable checks or test processes may be carried out for the redistribution circuit structure 110. In this way, whether the redistribution circuit structure 110, the first circuit board 150 electrically connected to the redistribution circuit structure 110, and the second circuit board 160 electrically connected to the redistribution circuit structure 110 function favorably can be determined, and the yield rate of the package structure 300 (shown in FIG. 3F) can be facilitated.

In an embodiment, the first chip 120 and/or the second chip 130 disposed on the redistribution circuit structure 110 may be known good dies (KGDs). For example, before the first chip 120 and/or the second chip 130 are disposed on the redistribution circuit structure 110, an electrical property test (e.g., open/short test, i.e., 0/S test), an appearance test (e.g., auto optical inspection (AOI)), or other suitable checks or test processes may be carried out for the first chip 120 and/or the second chip 130. In this way, whether the first chip 120 and/or the second chip 130 disposed on the redistribution circuit structure 110 function favorably can be determined, and the yield rate of the package structure 300 (as shown in FIG. 3F) can be facilitated.

Figure 3E:
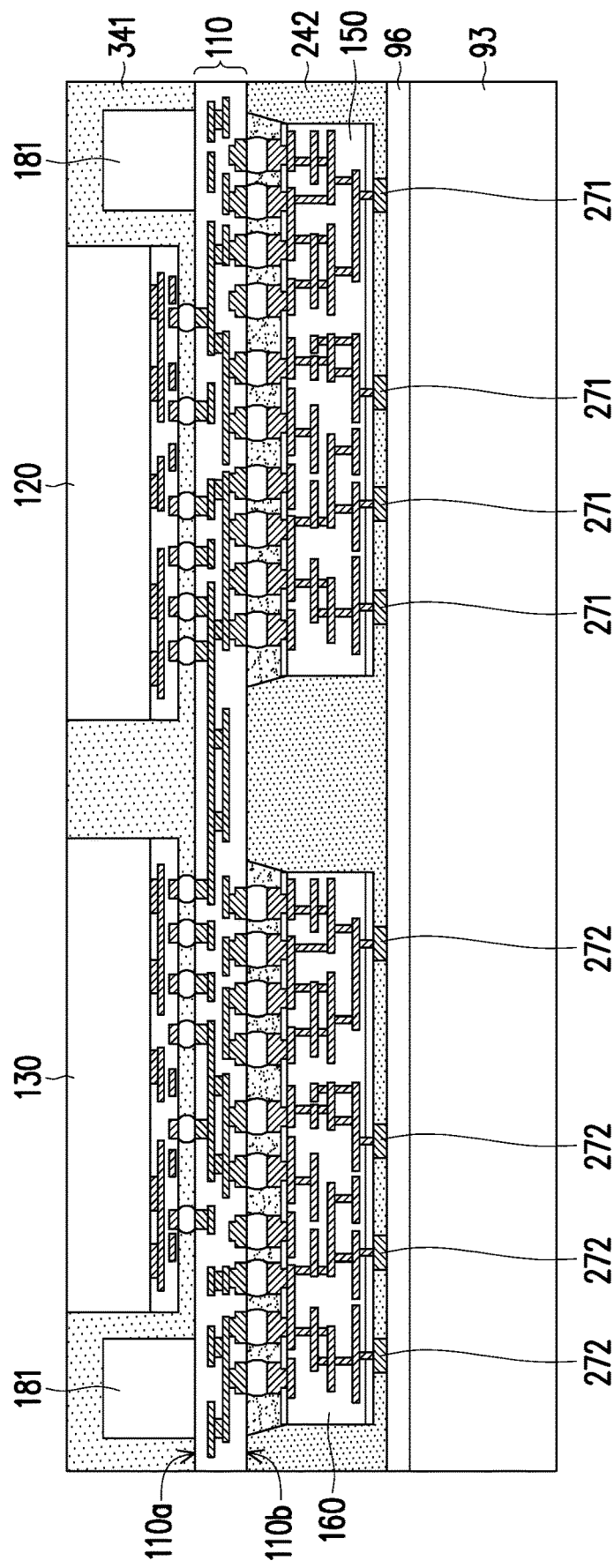
Figure 3F:
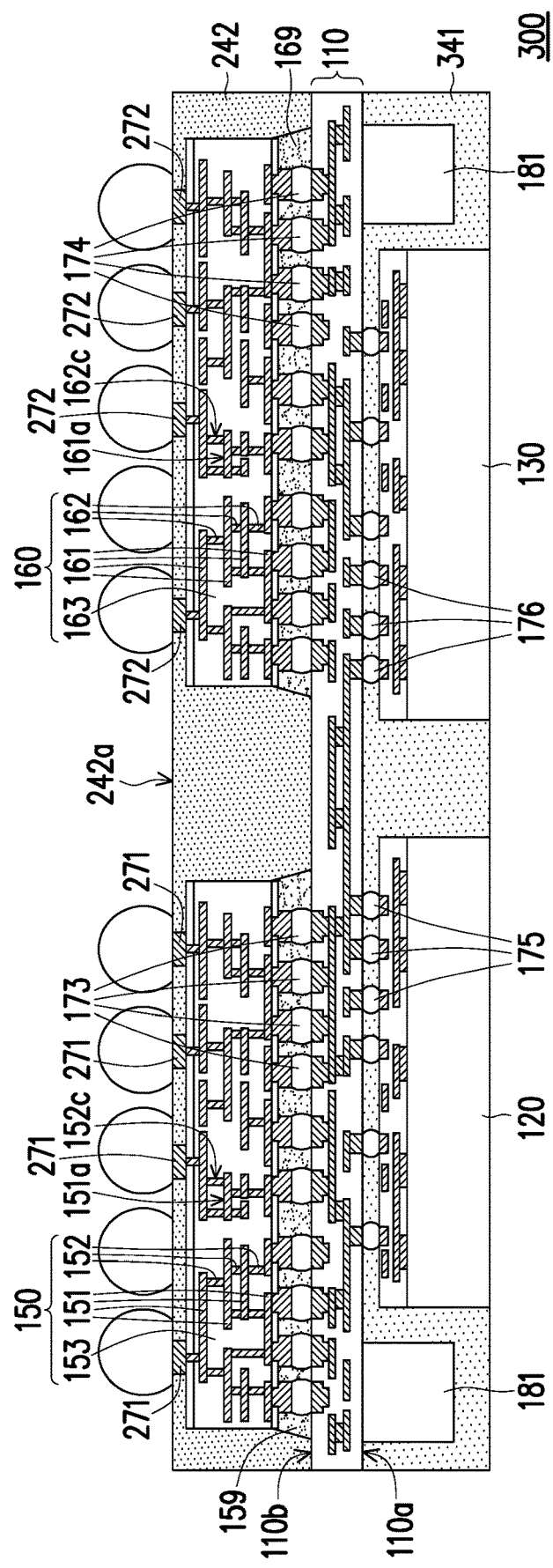

Referring to FIG. 3E, similar to the process shown in FIG. 1C, a first encapsulant 341 covering the first chip 120 and the second chip 130 may be formed. The process for forming the first encapsulant 341 may be the same as or similar to the first encapsulant 141 in the previous embodiment. Therefore, details in this regard will not be repeated in the following.

In the embodiment, a thinning process may be performed, so that the first encapsulant 341 exposes the first chip 120 or the second chip 130. However, the disclosure is not limited thereto.

Referring to FIG. 3F, after the first encapsulant 341 is formed, the third carrier plate 93 may be removed to expose the encapsulant top surface of the second encapsulant 242, the first conductive top surfaces 271*a* of the first conductive connectors 271, and the second conductive top surfaces 272*a* of the second conductive connectors 272.

Referring to FIG. 3F, similar to the process shown in FIG. 2C, the first conductive terminal 177 is disposed on the first circuit board 150, and the second conductive terminal 178 is disposed on the second circuit board 160.

After the above processes, the package structure 300 of the embodiment is substantially manufactured.

Referring to FIG. 3F, the package structure 300 may include the redistribution circuit structure 110, the first chip 120, the second chip 130, the first circuit board 150, the second circuit board 160, the conductive terminals 177 and 178, the first encapsulant 341, the second encapsulant 242, the first conductive connectors 271, and the second conductive connectors 272.

In terms of structure, the package structure 300 of the embodiment may be similar to the package structure 200 of the second embodiment.

In the embodiment, the first encapsulant 341 may encapsulate the first chip 120. In an embodiment, a portion of the first encapsulant 341 may be located between the first chip 120 and the redistribution circuit structure 110. In an embodiment, the first encapsulant 341 may cover the active surface 120*a* and the side surface 120*c* of the first chip 120. In an embodiment, the first encapsulant 341 may expose the back surface 120*b* of the first chip 120. In an embodiment, the first encapsulant 341 may further cover the first chip connector 175.

In the embodiment, the first encapsulant 341 may encapsulate the second chip 130. In an embodiment, a portion of the first encapsulant 341 may be located between the second chip 130 and the redistribution circuit structure 110. In an embodiment, the first encapsulant 341 may cover the active surface 130*a* and the side surface 130*c* of the second chip 130. In an embodiment, the first encapsulant 341 may expose the back surface 130*b* of the second chip 130. In an embodiment, the first encapsulant 341 may further cover the second chip connector 176.

Figure 4A:
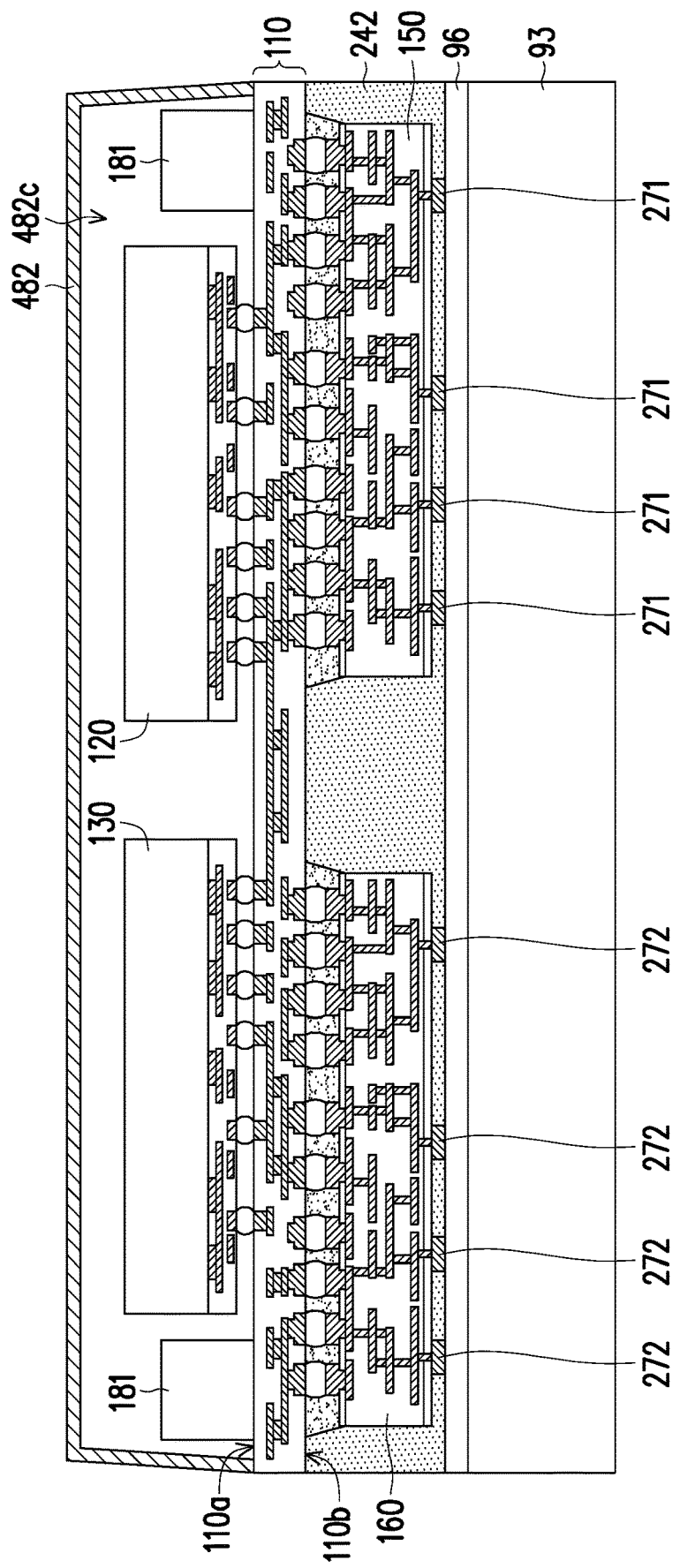
FIGS. 4A to 4B are schematic partial cross-sectional views illustrating a part of a manufacturing method of a package structure according to a fourth embodiment of the disclosure.
Figure 4B:
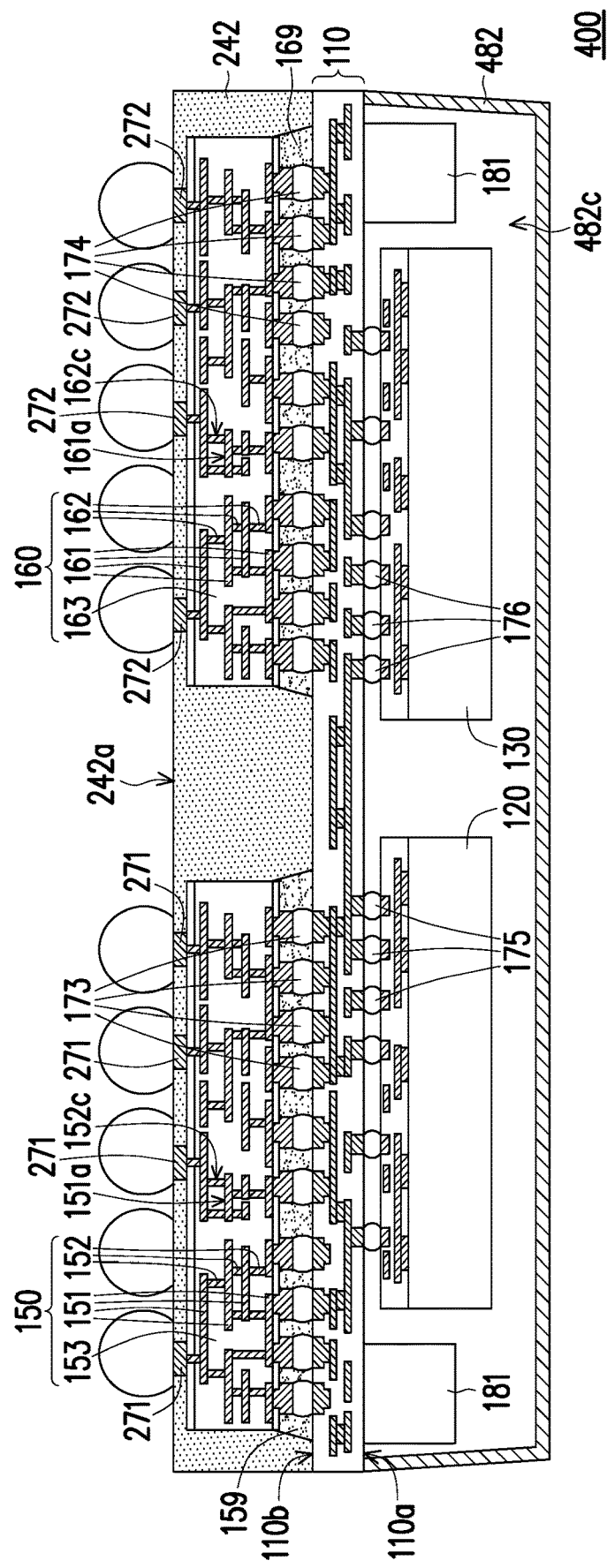

FIGS. 4A to 4B are schematic partial cross-sectional views illustrating a part of a manufacturing method of a package structure according to a fourth embodiment of the disclosure. The manufacturing method of a package structure 400 of the fourth embodiment is similar to the manufacturing method of the package structure 300 of the third embodiment. Therefore, similar components are represented by like symbols, have similar functions, and formed by similar materials or processes, and the same descriptions will not be repeated in the following. For example, FIG. 4A may be a schematic cross-sectional view illustrating the manufacturing method of the package structure 100 after the step of FIG. 3D.

After FIG. 3D, referring to FIG. 4A, in the embodiment, a case 482 may be disposed on the first connection surface 110*a* of the redistribution circuit structure 110. The case 482 may be directly or indirectly connected to the redistribution circuit structure 110. For example, the case 482 may be embedded into the redistribution circuit structure 110, so that the case 482 is directly connected to the redistribution circuit structure 110. As another example, an adhesive material may be provided between the case 482 and the redistribution circuit structure 110, so that the case 482 is indirectly connected to the redistribution circuit structure 110.

Referring to FIG. 4B, similar to the process shown in FIG. 3F, the first conductive terminal 177 may be disposed on the first circuit board 150 and the second conductive terminal 178 may be disposed on the second circuit board 160 after the third carrier plate 93 is removed.

After the above processes, the package structure 400 of the embodiment is substantially manufactured.

Referring to FIG. 4B, the package structure 400 may include the redistribution circuit structure 110, the first chip 120, the second chip 130, the first circuit board 150, the second circuit board 160, the conductive terminals 177 and 178, the second encapsulant 242, the first conductive connectors 271, the second conductive connectors 272, and the case 482. The case 482 may be disposed on the first connection surface 110*a* of the first redistribution structure 110. The first chip 120 and the second chip 130 may be located in an accommodating space of the case 482.

In an embodiment, the case 482 may include a rigid material. In this way, the case 482 can protect the components (e.g., the first chip 120, the second chip 130, and/or the stiffening support member 181) located therein.

In an embodiment, the case 482 may include a conductive material. In a possible embodiment, the conductive case 482 may serve for electromagnetic interference (EMI) shielding, so as to reduce electromagnetic interference. However, the disclosure is not limited thereto. In a possible embodiment, a conductive portion of the case 482 may serve as an antenna. However, the disclosure is not limited thereto.

In view of the foregoing, in the package structure of the disclosure having a plurality of chips (e.g., the first chip and the second chip), power or signal transmission between the chips (e.g., between the first chip and the second chip) needs to be carried out through a corresponding circuit, and the respective chips may require corresponding circuits to transmit power or signals to the outside. For example, the first chip and the second chip may transmit power or signals to external electronic components connected to the conductive terminals through the corresponding conductive terminals. Therefore, by disposing a plurality of circuit boards (e.g., the first circuit board and the second circuit board) on the redistribution circuit structure, the manufacturing method of the package structure can be simple, and/or the cost can be reduced. In addition, for the overall circuit layout of the package structure, the load of the redistribution circuit structure can be reduced (e.g., the number of conductive layers in the redistribution circuit structure can be reduced, the line width, the line spacing, and/or the circuit layout of the conductive layers of the redistribution circuit structure can be easily optimized). Accordingly, the quality of the package structure can be facilitated.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A package structure, comprising:
   a redistribution circuit structure, having a first connection surface and a second connection surface opposite to the first connection surface;
   a first chip, disposed on the first connection surface and electrically connected to the redistribution circuit structure;
   a second chip, disposed on the first connection surface and electrically connected to the redistribution circuit structure;
   a first circuit board, disposed on the second connection surface and electrically connected to the redistribution circuit structure;
   a second circuit board, disposed on the second connection surface and electrically connected to the redistribution circuit structure; and
   a plurality of conductive terminals, disposed on a side of the first circuit board away from the redistribution circuit structure or on a side of the second circuit board away from the redistribution circuit structure, and electrically connected to the first circuit board or the second circuit board.

2. The package structure as claimed in claim 1, wherein the first circuit board and the second circuit board are Si-substrate-free circuit boards.

3. The package structure as claimed in claim 1, wherein in a projection direction perpendicular to the first connection surface or the second connection surface, the first chip and the second chip are not overlapped, and the first circuit board and the second circuit board are not overlapped.

4. The package structure as claimed in claim 3, wherein in the projection direction, the first circuit board and the second circuit board are completely overlapped with the redistribution circuit structure.

5. The package structure as claimed in claim 1, further comprising:
   a stiffening support member, disposed on the first connection surface and connected to the redistribution circuit structure.

6. The package structure as claimed in claim 5, wherein the stiffening support member is ring-shaped, and the first chip and the second chip are located in the ring-shaped stiffening support member.

7. The package structure as claimed in claim 5, wherein in a projection direction perpendicular to the first connection surface or the second connection surface, the stiffening support member is overlapped with the first circuit board or the second circuit board.

8. The package structure as claimed in claim 1, further comprising:
   an encapsulant, encapsulating the first chip and the second chip or encapsulating the first circuit board and the second circuit board.

9. The package structure as claimed in claim 8, wherein the encapsulant encapsulates the first circuit board and the second circuit board, and the package structure further comprises:
   a plurality of conductive connectors, disposed on the first circuit board or the second circuit board, wherein the conductive terminals are electrically connected to the first circuit board or the second circuit board through the corresponding conductive connectors.

10. The package structure as claimed in claim 9, wherein the conductive connectors have conductive top surfaces, the encapsulant has an encapsulant top surface, and the conductive top surfaces and the encapsulant top surface are substantially coplanar.

11. The package structure as claimed in claim 1, wherein:
    the first chip has a first active surface, and the first active surface faces the first connection surface, and
    the second chip has a second active surface, and the second active surface faces the first connection surface.

12. A manufacturing method of a package structure, comprising:
    forming a redistribution circuit structure having a first connection surface and a second connection surface opposite to the first connection surface;
    disposing a first chip on the first connection surface, and electrically connecting the first chip to the redistribution circuit structure;
    disposing a second chip on the first connection surface, and electrically connecting the second chip to the redistribution circuit structure;
    disposing a first circuit board on the second connection surface, and electrically connecting the first circuit board to the redistribution circuit structure;
    disposing a second circuit board on the second connection surface, and electrically connecting the second circuit board to the redistribution circuit structure; and
    disposing a plurality of conductive terminals on a side of the first circuit board away from the redistribution circuit structure or on a side of the second circuit board away from the redistribution circuit structure, and electrically connecting the conductive terminals to the first circuit board or the second circuit board.

13. The manufacturing method of the package structure as claimed in claim 12, further comprising:
    providing a carrier plate;
    forming the redistribution circuit structure on the carrier plate, wherein the second connection surface faces the carrier plate;
    disposing a stiffening support member on the first connection surface, wherein the stiffening support member is connected to the redistribution circuit structure; and
    removing the carrier plate after disposing the stiffening support member.

14. The manufacturing method of the package structure as claimed in claim 12, further comprising:
    disposing the redistribution circuit structure on a carrier plate after forming the redistribution circuit structure, wherein the second connection surface faces the carrier plate;
    disposing a stiffening support member on the first connection surface, wherein the stiffening support member is connected to the redistribution circuit structure; and
    removing the carrier plate after disposing the stiffening support member.

15. The manufacturing method of the package structure as claimed in claim 12, further comprising:
    disposing a plurality of conductive connectors on the first circuit board or the second circuit board and electrically connecting the conductive connectors to the first circuit board or the second circuit board;
    forming an encapsulant on the second connection surface, wherein the encapsulant encapsulates the first circuit board and the second circuit board and exposes the conductive connectors; and
    disposing the conductive terminals on the conductive connectors, wherein the conductive terminals are electrically connected to the first circuit board or the second circuit board through the corresponding conductive connectors.

16. The manufacturing method of the package structure as claimed in claim 15, wherein forming the encapsulant comprises:
   forming an encapsulant material to cover the conductive connectors, the first circuit board, and the second circuit board; and
   performing a thinning process to remove a portion of the encapsulant material, so as to form the encapsulant that laterally covers the first circuit board and the second circuit board and exposes the conductive connectors.

* * * * *